US008462037B2

(12) United States Patent
Singer et al.

(10) Patent No.: US 8,462,037 B2
(45) Date of Patent: Jun. 11, 2013

(54) METHOD AND SYSTEM HAVING ADJUSTABLE ANALOG-TO-DIGITAL CONVERSION LEVELS

(75) Inventors: Andrew Carl Singer, Champaign, IL (US); Naresh Shanbhag, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 12/946,621

(22) Filed: Nov. 15, 2010

(65) Prior Publication Data

US 2011/0115660 A1 May 19, 2011

Related U.S. Application Data (60) Provisional application No. 61/261,200, filed on Nov. 13, 2009.

(51) Int. Cl.
*H03M 1/12* (2006.01)
(52) U.S. Cl.
USPC .......................................... 341/155; 341/159

(58) Field of Classification Search
USPC .................... 341/155, 120, 118, 161, 159
See application file for complete search history.

(56) References Cited

U.S. PATENT DOCUMENTS

| | | | | |
|---|---|---|---|---|
| 6,373,423 | B1 * | 4/2002 | Knudsen | 341/159 |
| 7,656,340 | B2 * | 2/2010 | Gribok et al. | 341/161 |
| 2007/0096972 | A1 * | 5/2007 | Kobayashi et al. | 341/155 |
| 2009/0267821 | A1 * | 10/2009 | Chmelar et al. | 341/159 |

* cited by examiner

*Primary Examiner* — Peguy Jean Pierre
(74) *Attorney, Agent, or Firm* — Blanchard & Associates (57) ABSTRACT

An adaptive Analog to Digital Converter (ADC) that adjusts the representation levels used in the conversion process so as to optimize system performance. By establishing system performance criteria by which to select or adjust the signal value range associated with each digital representation and/or the digital representation, substantially fewer bits may be used in the ADC. The systems and methods described herein enable lower-power, smaller form-factor designs as well as very high-speed operation. In particular, this technology may be beneficial for use in communications systems because it enables ADC's to operate at speeds where traditional ADC designs simply cannot.

20 Claims, 6 Drawing Sheets

METHOD AND SYSTEM HAVING ADJUSTABLE ANALOG-TO-DIGITAL CONVERSION LEVELS

CROSS-REFERENCE TO RELATED APPLICATION

The present application claims priority to U.S. Provisional Application Ser. No. 61/261,200, filed on Nov. 13, 2009, the entire content of which is incorporated by reference.

FIELD OF INVENTION

The present invention relates to signal processing and conversion of signals from an analog format to a quantized discrete time form.

BACKGROUND

An Analog to Digital converter (ADC) takes samples of an analog signal and uses the samples to produce a digital signal. The samples are quantized so that at each sampling time only one of $2^K$ numbers is generated by a K-bit ADC. The most common ADCs sample analog voltages and generate numbers, typically in binary form, representing the voltage.

The signal amplitude levels, or thresholds, that the ADC uses to generate the digital numbers are usually taken to be equally-spaced in amplitude for a general purpose ADC. In some ADCs, however, the thresholds are non-linearly spaced, such as converters conforming to the well-known µ-law or A-law conversion format used in many voiceband communication systems. These systems implement an approximate logarithmic transfer function using piecewise linear segments, each segment having a different slope so that the regions around the lower amplitude levels suffer less quantization error. In this way, these ADCs, using only eight data bits, are able to provide an acceptable signal-to-noise ratio for the low amplitude signals while maintaining a relatively wide dynamic range, whereas twelve bits would be required in a linear ADC to achieve the similar dynamic range and signal to noise ratio.

SUMMARY

In exemplary embodiments, an adaptive Analog to Digital Converter (ADC) is disclosed that adjusts the representation levels used in the conversion process so as to optimize some explicit measure of system performance. By establishing system performance criteria by which to select or adjust the signal value range associated with each digital representation (as well as the digital representations themselves), substantially fewer bits may be used in the ADC. The systems and methods described herein enable lower-power, smaller form-factor designs as well as very high-speed operation. In particular, this technology may be beneficial for use in communications systems because it enables ADC's to operate at speeds where traditional ADC designs simply cannot.

In one embodiment, a digital communications receiver utilizes detection rules for making symbol decisions, wherein the detection rules are expressed in terms of input signal ranges. The ADC is adjusted in response to the input ranges specified by the detection rules. By using a detection criterion, the probability of correctly detecting a transmitted bit is increased.

Received signals in a digital communication system are deemed to be noisy versions of a finite alphabet of symbols. In one embodiment, signal statistics are exploited to assign threshold and levels in the ADC to improve system performance. The receive signals are analyzed to determine estimates of the finite alphabet symbols and their corresponding symbol amplitude levels. The ADC thresholds are adjusted to lie between the measured estimated values of the symbol amplitude levels.

In an alternative embodiment, a channel estimate together with the data symbol alphabet is used to determine the finite symbol alphabet output by the channel. The ADC thresholds are adjusted to lie between the elements of the finite symbol alphabet output by the channel.

In some embodiments, an adaptation algorithm is used to adjust the ADC threshold levels. In particular, a gradient ascent or descent algorithm may be used to adjust the ADC levels so as to reduce or minimize an error signal or the system bit error rate performance, or some other metric that is associated with system performance, such as an approximation to the bit error rate performance, or another measure related to the system performance such as the likelihood of the transmitted symbols, or the mutual information between transmitted symbols and detected symbols at the communication receiver output.

In an alternative embodiment, the threshold levels may be adjusted via perturbing the threshold levels and determining whether one or more performance criteria indicate an improvement.

These as well as other features and advantages will become apparent to those of ordinary skill in the art by reading the following detailed description, with appropriate reference to the accompanying drawings.

BRIEF DESCRIPTION OF FIGURES

Exemplary embodiments of the present invention are described with reference to the drawings, in which.

DETAILED DESCRIPTION OF EXEMPLARY EMBODIMENTS

Figure 1:
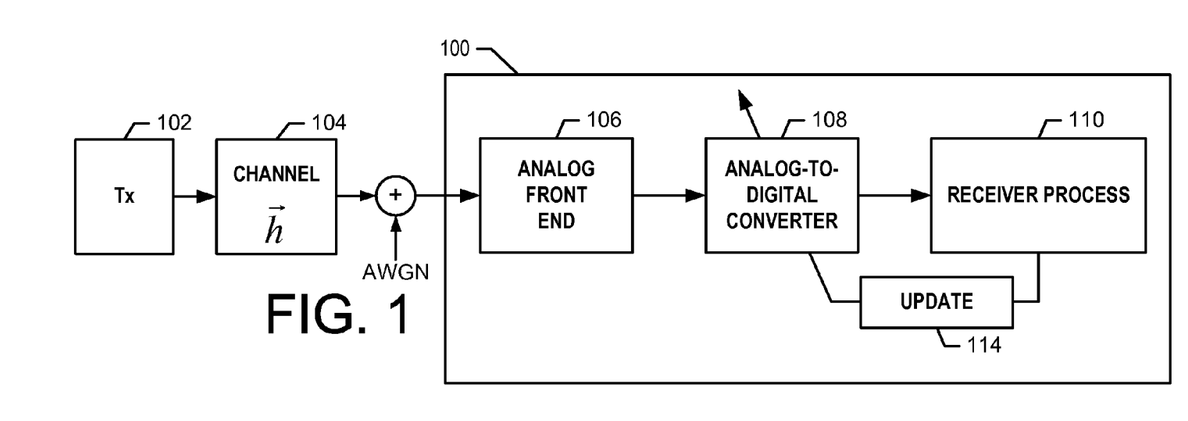
FIG. 1 is a block diagram illustrating an embodiment of a digital communications receiver.

In an exemplary embodiment, a method and system of adjusting an adaptive Analog to Digital Converter (ADC) is disclosed. With reference to FIG. 1, a communication receiver 100 that adjusts the representation levels used in the conversion process will be described. Data symbols are transmitted by transmitter 102, and are passed through the channel, modeled by channel filter 104. The receiver 100 comprises an analog front end 106, and analog-to-digital converter 108, a receiver process 110, and an update routine 114 for adjusting the analog-to-digital converter 108. The data symbols originating from transmitter 102 may be conveyed to the receiver 100 over any kind of medium, including optical fiber, wireless, wireline, etc. The symbols can take any one of a number of different formats, such as a baseband signal, an amplitude, phase, and/or frequency modulated radio frequency carrier, a modulated optical signal, that might be either coherently modulated or non-coherently modulated, etc.

The communication signal carrying the symbols is passed through the communications channel 104. Once at the receiver 100, the communication signal may be processed by analog front-end 106. This may include analog filtering, frequency conversion (down to an intermediate or baseband frequency), signal separation into constituent components such as in phase and quadrature signal components, etc. It is preferred, but not required that the analog-to-digital converter 108 operates on baseband signals and provides the samples of the baseband signal to the receiver process 110. Bandpass sampling methods are known in the art, and the methods described here can be readily applied to passband sampling as well. The receiver process 110 operates on the samples, or channel observations, and uses them to recover the original data symbol stream. Based on various criteria, the update block 114 is used to set and or adjust the quantization levels in the ADC 108.

Figure 2:
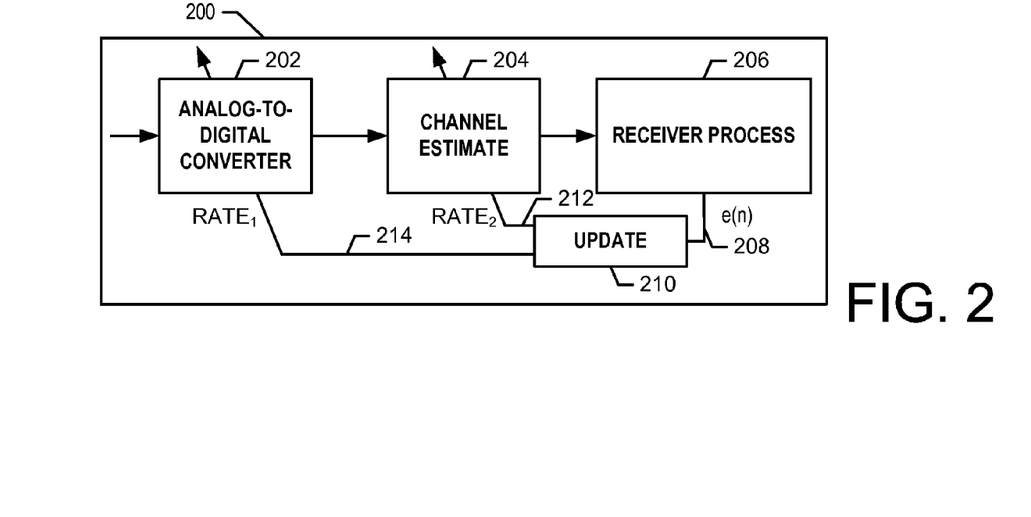
FIG. 2 illustrates an alternative embodiment of a digital communications receiver.

As described herein below, the receiver process 110 may take many different forms. In addition, the update block 114 may take numerous forms, and may adjust different components of the system at different rates. Specifically, as shown in FIG. 2, within receiver 200, the ADC 202, and channel estimator block 204, may be adjusted by update block 210 at different rates. Channel estimate block 204 is updated at RATE2 as shown by line 212, while the ADC 202 is updated at RATE1 as shown by line 214. In one embodiment comprising an optical communications system, the analog-to-digital converter 202 is updated at a 12 GHz rate while the channel estimate block 204 is updated at an 800 MHz rate.

There are many types of ADC architectures available today that may be used with the methods described herein, including flash architectures, subranging architectures, multistep architectures, pipelined/multistage architectures and parallel pipelined architectures. Further, the methods herein can be implemented on various hardware structures such as a Field-programmable gate array (FPGA), a custom Application-specific integrated circuit (ASIC), or as instructions stored in a tangible computer readable medium such as a memory device, optical or magnetic disk, etc., for execution on a microprocessor, digital signal processor, or the like.

Figure 3A:
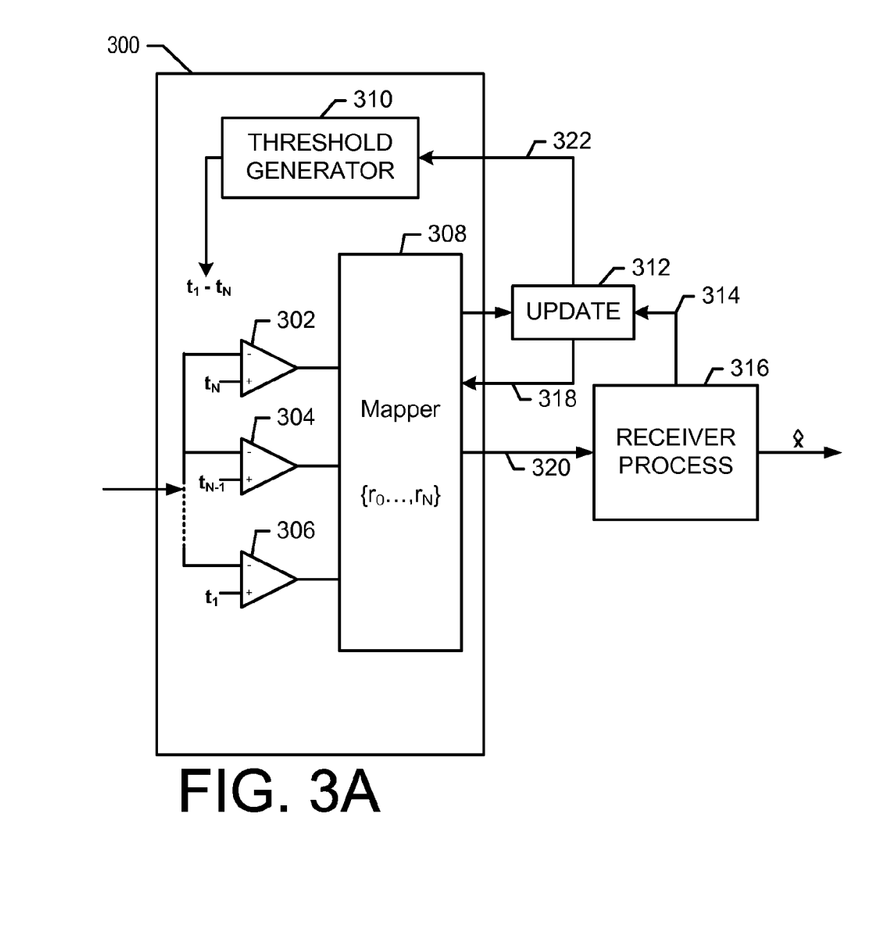
FIG. 3A is one embodiment of an adjustable analog-to-digital converter.

FIG. 3A depicts components of one embodiment of an adjustable analog-to-digital converter 300 based on a flash converter architecture. The analog input is applied to N voltage comparators depicted as comparators 302, 304, 306. Each comparator has a threshold voltage input $t_1, t_{N-1}, t_N$, generated by threshold level generator 310. The comparators compare the input signal with their threshold levels simultaneously. If the input signal exceeds the threshold level, the corresponding comparator outputs a logic 1. The comparators collectively output a thermometer code, for example 1110000. The thermometer codes are then mapped by mapping block 308 into digital discrete time values that are provided to receiver process 316 via line 320 for further processing.

The output of the mapping block 308 may be a binary value representation of the highest threshold value comparator that has a logic 1 output. In another embodiment, only a subset of the comparators are active at one time, for example, an ADC may have enough comparators to perform 8-bit operations, but only operate in a 2-bit mode (8-bit and 2-bit are merely examples, other values may be appropriate as well). By reducing the number of bits, the ADC can use lower power and operate at a higher speed.

The update block 312 preferably controls the threshold generator 310, and also controls the mapping block 308. As described more fully below, the update block 312 may operate using a number of different methodologies. In one embodiment, the update block 312 utilizes detection rules for making symbol decisions, wherein the detection rules are expressed in terms of input signal ranges. The ADC 300 is adjusted in response to the input ranges specified by the detection rules.

Alternatively, the receive signals are analyzed to determine estimates of a finite symbol alphabet and their corresponding symbol amplitude levels. This would include, for example, analysis of a so-called eye diagram to determine the average or expected value of the distorted symbols. The ADC thresholds are adjusted to lie between the measured estimated values of the symbol amplitude levels. Still further, a channel estimate may be used to determine the anticipated signal distortion of the data symbol alphabet. The ADC thresholds are adjusted to lie between the elements of the finite symbol alphabet. This technique may also be combined with Viterbi, or other equalization techniques. Adaptation algorithms may also be used to adjust the ADC. In particular, a gradient algorithm may be used to adjust the ADC levels so as to reduce or minimize an error signal or a bit error rate performance, or the threshold levels may be adjusted randomly via perturbing the threshold levels and determining whether one or more performance criteria indicate an improvement, and the random perturbation may be selected to remain if improvement was indicated.

The threshold generator 310 may be implemented using a Digital-to-Analog voltage converter to generate the analog threshold voltages under digital control. In some embodiments, the threshold level generator 310 may comprise a plurality of digital to analog converters, each configured to output a threshold voltage to a comparator. The update block 312 preferably provides the threshold generator 310 with digital words on line 322 representing the desired threshold values, the digital words representing the desired threshold values may be considered control inputs. In some embodiments, the update block 312 provides analog voltages to the threshold generator 310. The resolution of the desired threshold voltages may be made arbitrarily fine by using an appropriate DAC. An array of current mirrors may also be used, wherein each threshold voltage may be generated by a resistor in series with multiple parallel legs of a current mirror, with each leg being selectively enabled. Other voltage generating circuits and techniques may also be used.

In some embodiments, the converter described herein simply converts voltages using the threshold values provided by way of loading register values. The register values are directly converted to thresholds via, e.g., a DAC. In other embodiments, the converter may take on a more active role in the adaptation process by implementing at least a portion of the adaptation algorithm. Thus, the threshold generator control signals may also take the form of instructions to increase or decrease a given threshold. For example, a control word provided to the threshold generator 310 may identify one or more thresholds and may indicate that the respective digital words provided to a DAC be incremented or decremented by one or more steps. The converter may also include instructions in the form of firmware to control a periodic and/or sequential dithering of the threshold values while the signal statistics are analyzed.

Figure 3B:
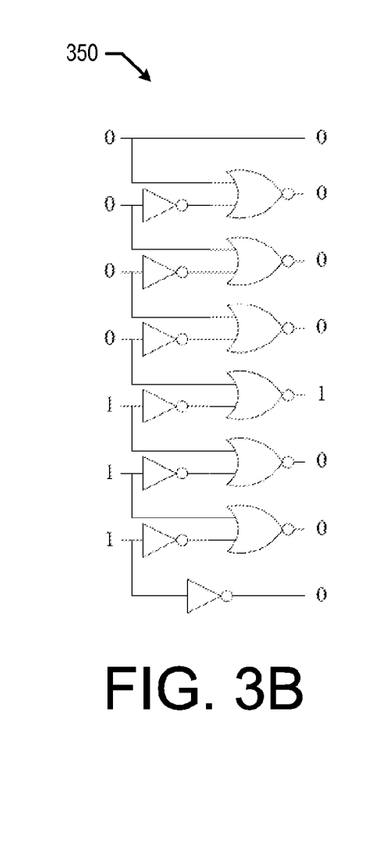
FIG. 3B illustrates a pre-coder for use with the adjustable analog-to-digital converter.
Figure 3C:
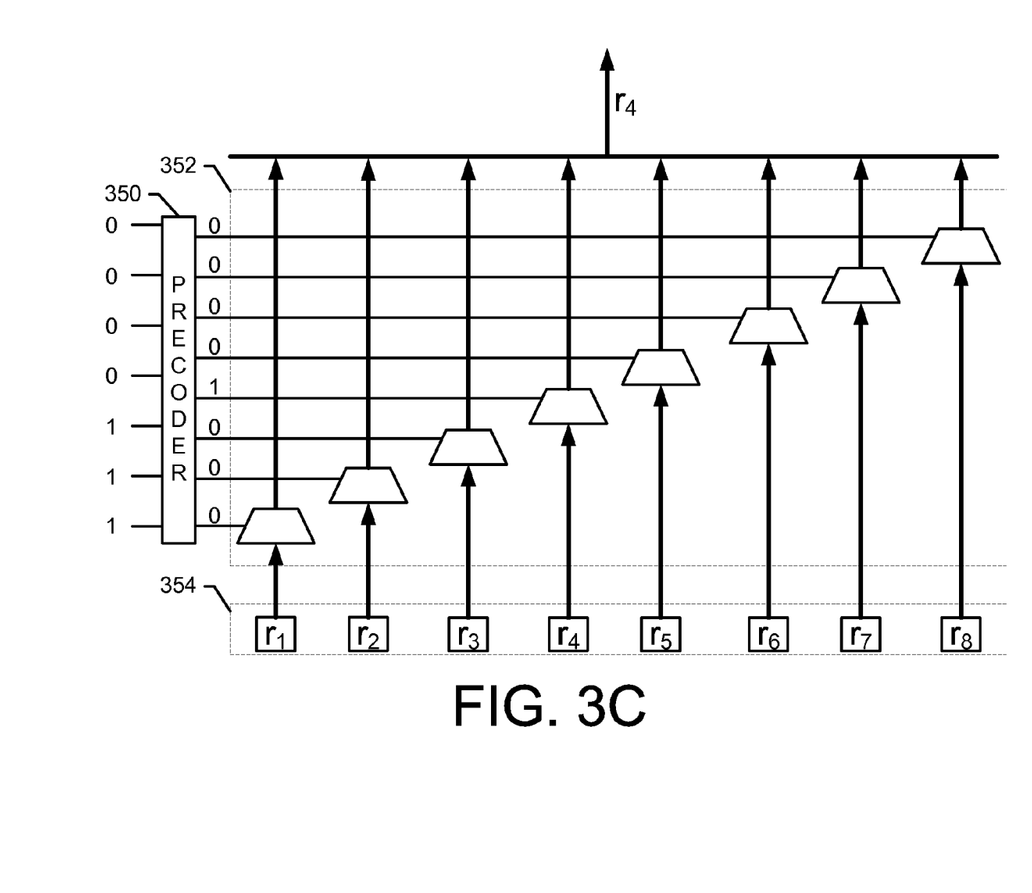
FIG. 3C illustrates one embodiment of components of an adjustable analog-to-digital converter.
Figure 3D:
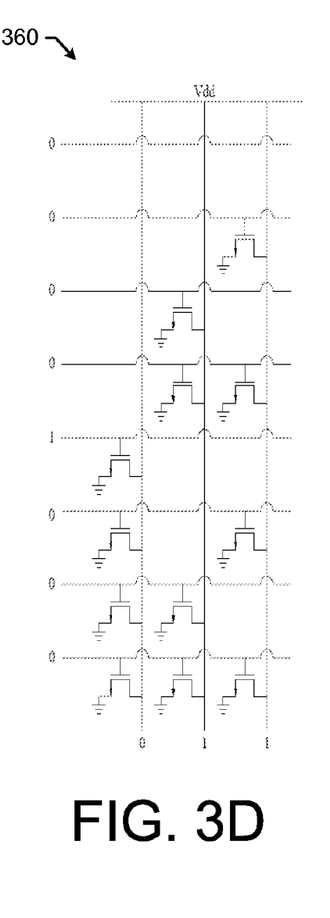
FIG. 3D illustrates a binary coder for use in combination with the position data of the pre-coder to generate a memory address of a representation value.

The mapping block 308 is preferably implemented using a pre-coder followed by selectable registers or memory. An exemplary pre-coder 350 is shown in FIG. 3B. The pre-coder 350 accepts a seven bit thermometer code and detects the position where the thermometer code changes from 1 to 0. The eight bit output contains position information. As shown in FIG. 3C, the selectors 352 use the position information from the pre-coder 350 to generate a binary code stored in memory 354. In an alternative embodiment, a pre-coder transforms the thermometer code into a binary code or gray code that is used to address a register or memory location in the memory device. In this embodiment the pre-coder would provide only three output bits, as shown in the binary encoder 360 in FIG. 3D. That is to say, in this embodiment, the mapper does not need to provide data values stored in registers 354, but merely provide a sequential binary value, such as by converting the thermometer code to a sequential binary value without explicit reference or mapping to the threshold value.

In preferred embodiments the data values stored in the registers 354 are adjustable. In addition, the number of binary digits, or bits, may also be selected and/or adjusted. Thus the converter 300 preferably includes a plurality of selectable or adjustable input signal thresholds to dynamically determine the regions of the input signal that will be grouped together in a single quantization level, as well as the flexibility of adjusting the values (and resolution) of the corresponding binary output quantized value. Preferably, the update block 312 provides the mapper 308 with the particular representation values for each quantizer level. In alternative embodiments, software may be used to convert the thermometer code, the position code, or the binary or gray code, into a corresponding representation level for use by the receiver process.

Figure 4A:
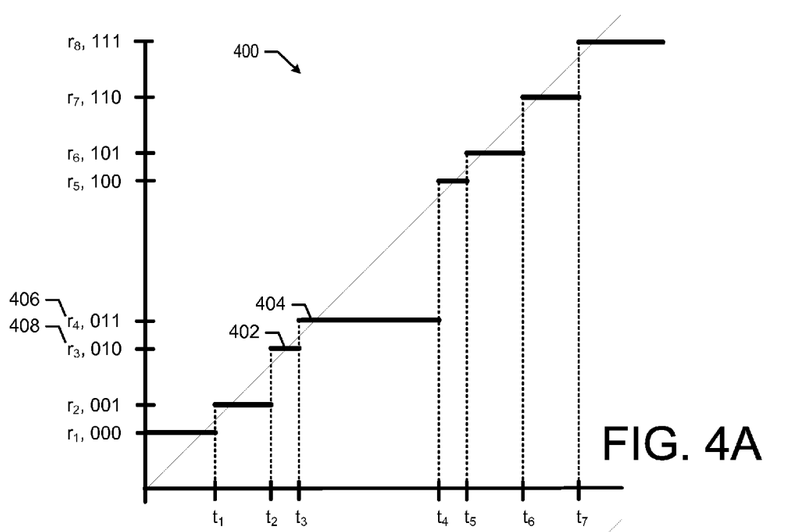
FIGS. 4A and 4B illustrate transfer functions of an adjustable analog-to-digital converter.
Figure 4B:
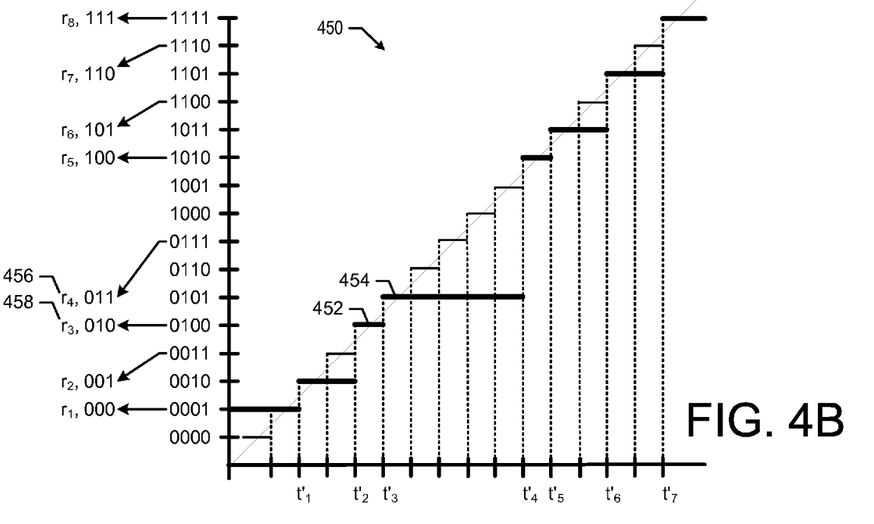

The ADC transfer function 400 is depicted in FIG. 4A and transfer function 450 in FIG. 4B, where the analog signal range (e.g., voltage or current, etc) is shown along the horizontal axis, and the corresponding quantized output shown along the vertical axis. For the transfer functions 400, 450, the input signal values are grouped into regions shown by the dark horizontal lines (e.g., region 402, 404, and region 452, 454) by designating certain thresholds, $t_1$, $t_2$, $t_3$, $t_4$, $t_5$, $t_6$, and $t_7$ (and $t'_1$-$t'_7$). Region 402 is delineated by thresholds $t_2$ and $t_3$, while region 404 is between thresholds $t_3$ and $t_4$. The specific values of the thresholds of FIGS. 4A and 4B are for illustrative purposes only. Also for purposes of illustration, FIGS. 4A and 4B both depict an ADC using a pre-coder that provides a three bit binary output.

In one preferred embodiment, the threshold values may be adjusted incrementally using a digital to analog converter to provide any desired thresholds. The corresponding quantizer level such as levels 406, 408 may be identified or specified using a smaller binary word (i.e., fewer binary digits) than would otherwise be required in a linear ADC. Of course, the quantizer level may be further converted to a representation level having any desired number of bits. In an alternative embodiment, the ADC may include necessary components so that the ADC is capable of operating in a linear mode at a relatively high resolution. During operation, selected comparators may be disabled, causing the ADC to operate using non-linearly spaced thresholds, as indicated in FIG. 4B. That is, the only comparators used are those operating with thresholds labeled with $t'_1$-$t'_7$. Comparators that do not have thresholds labeled with $t'_1$-$t'_7$ may be disabled temporarily. The ADC circuitry may provide the three bit quantization levels which are then mapped to higher resolution representation levels using additional circuitry or software as described above.

Receiver Process Using Signal Statistics

Figure 6A:
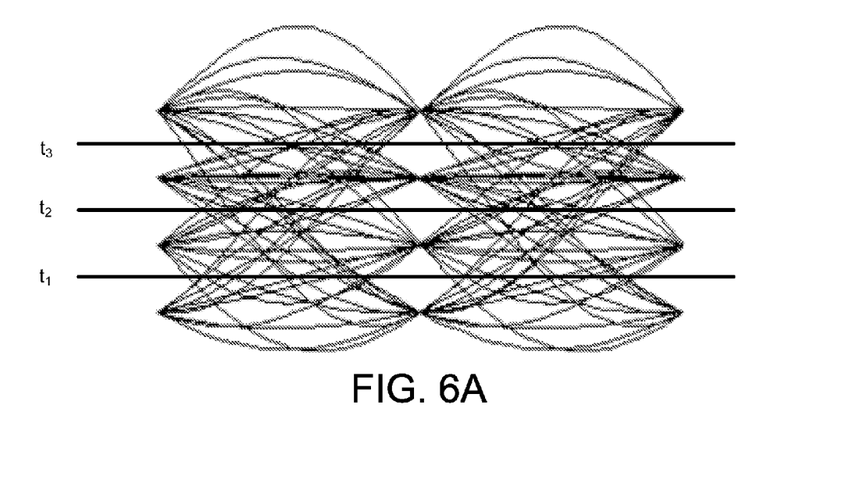
FIGS. 6A and 6B show eye diagrams corresponding to a received digital communications signal.
Figure 6B:
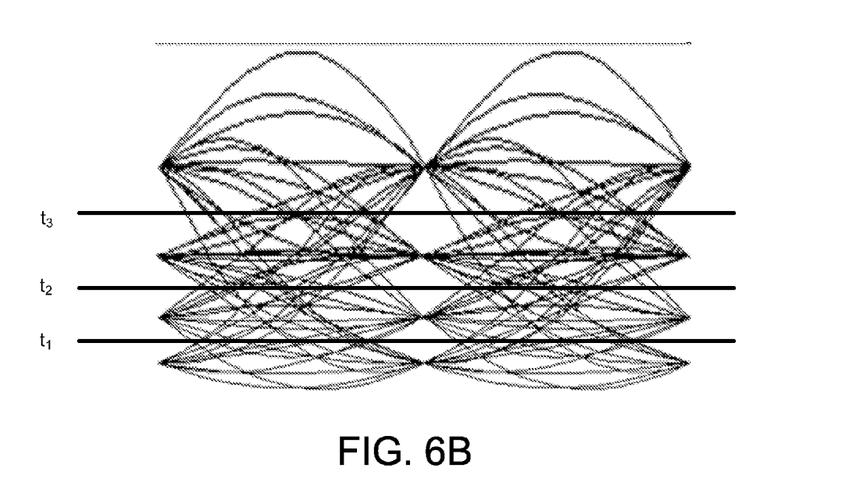

In one embodiment, received signals in a digital communication system are deemed to be noisy versions of a finite alphabet of symbols. The received signals are analyzed with a processor or custom integrated circuit hardware to determine estimates of the finite symbol alphabet and their corresponding symbol amplitude levels. As shown in FIGS. 6A and 6B, waveforms of data symbols are superimposed over each other to form an eye-diagram, well know to those of skill in the art. The data symbols, after being distorted, are typically centered at a finite number of levels—the levels being determined by the channel impulse response (including linear and non-linear distortion). This accounts for so-called eye-diagrams, where the channel observations tend to cluster near specific regions at or near the center of the symbol period, and typically do not take on intermediate values except during symbol transitions, thereby creating an "eye". Thus the receiver may implement an algorithm to determine the average location for each of the clusters by analyzing the sampled signal waveforms.

The signal waveforms are analyzed in the receiver and the ADC thresholds are preferably adjusted to lie between the measured estimated values of the symbol amplitude levels. The analysis of the signal waveforms may be performed in any number of ways, including using a full resolution ADC to sample the waveforms, and then after determining the desired thresholds, the ADC may operate in reduced resolution mode. For example, two bits may be used to convey the quantizer value. Note that while the eye diagram of FIG. 6A is evenly spaced, the eye openings in FIG. 6B are not even, and thus the thresholds after adjustment are unevenly spaced.

Receiver Process Using Detection Rules

In an alternative embodiment, a digital communications receiver utilizes detection rules for making symbol decisions, wherein the detection rules are expressed in terms of input signal ranges. The ADC is adjusted in response to the input ranges specified by the detection rules. The detection rules may provide detection regions that span multiple symbol periods, or otherwise lead to state-dependent input ranges, where the input signal ranges would depend on previously observed inputs or upon some other information given to the ADC from another part of the system, for example from a decoder for forward error correction. These detection rules may be implemented either as instructions in a computer readable medium for execution upon a processor or as a discrete component such as an FPGA or ASIC.

Receiver Process Using Channel Estimate

In an alternative embodiment, a channel estimate together with the data symbol alphabet is used to determine the finite symbol alphabet output by the channel. That is, a channel estimate may be used to determine how the data symbol alphabet will be distorted. The channel estimate may be modeled as a finite impulse response (FIR) filter that causes intersymbol interference. The finite data symbol alphabet (in the form of baseband pulses of varying amplitude) put through the channel will generate a finite alphabet of distorted pulses. The ADC thresholds are adjusted to lie between the elements of the finite alphabet of distorted pulses. In one embodiment, the FIR filter, the channel estimator, and the distorted pulse analyzer are implemented as instructions in a computer readable medium for execution upon a processor or as a discrete component such as an FPGA or ASIC.

Receiver Process Using Adaptation Algorithm

In some embodiments, an adaptation algorithm is used to adjust the ADC threshold levels. In particular, a gradient algorithm may be used to adjust the ADC levels so as to reduce or minimize an error signal or a bit error rate performance or to maximize some other measure of system performance, such as signal to noise ratio, output symbol or sequence likelihood, or mutual information. In one embodiment, the threshold levels may be adjusted via perturbing the threshold levels and determining whether one or more performance criteria indicate an improvement. In one embodiment the threshold levels are perturbed randomly or pseudo-randomly, and such processes shall include, but not be limited to, generating perturbation events without a deterministic pattern of occurrences. Additionally, these processes may be pseudo-random, thus resulting in a deterministic pattern of occurrences that exhibit some form of statistical randomness. This random perturbation could further reduce hardware requirements, as new threshold levels are not calculated but rather randomly adjusted. In one embodiment, the adaptive algorithm is realized on an FPGA or ASIC. As another embodiment, the adaptive algorithm is stored as instructions in a computer readable medium, that when executed on a processor implement the algorithm.

Figure 5:
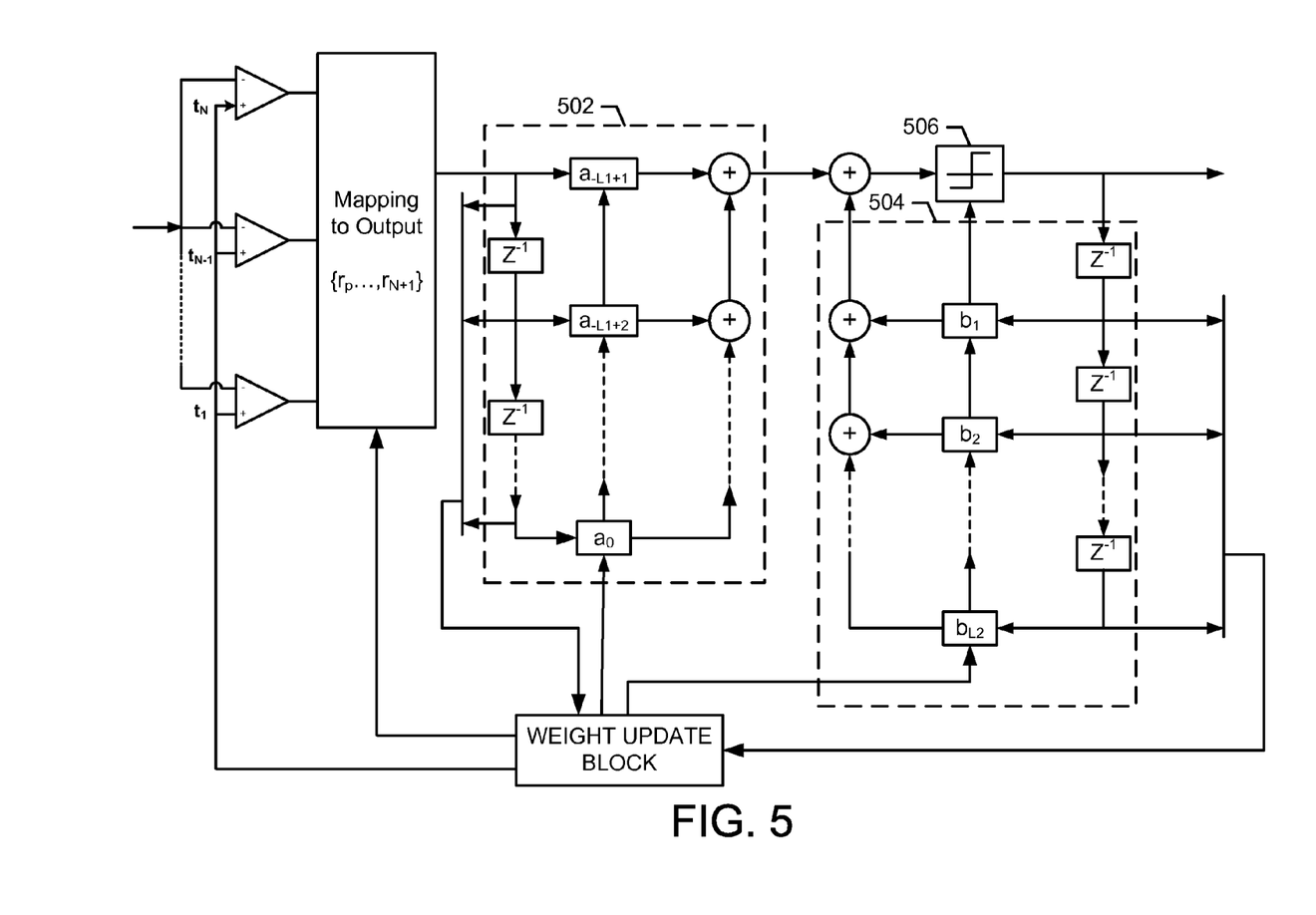
FIG. 5 is a block diagram of one embodiment of an adjustable analog-to-digital converter in conjunction with a communications receiver having a decision feedback equalizer architecture.

In one alternative embodiment, a decision feedback equalizer architecture may be used, such as the one shown in FIG. 5. The DFE employs two filters to equalize the channel. The feedforward filter a 502 takes the output of the ADC as the input. The feedback filter b 504 takes the previous decoded symbols as the input. A linear combination of the outputs of these two filters is passed through a slicer 506 which determines what symbol was transmitted. The feedforward filter 502 can be thought of as a filter which suppresses anticausal or pre-cursor ISI. It leaves behind the causal or post-cursor ISI which is eliminated using the feedback filter 506. In one embodiment, the update algorithm is derived from the AMBER algorithm, which comes close to minimizing the probability of error in a DFE architecture. Noticing that the form of the AMBER algorithm is similar to a sign-least mean square (sign-LMS) algorithm, we first establish the sign-LMS solution according to the expected value of the squared error, $e_k$, wherein $z_k$ is the input to the slicer and $x_k$ is the actual symbol transmitted.

$$e_k = z_k - x_k$$

$$= \sum_{j=0}^{-L_1+1} a_j s_{k-j} - \sum_{j=1}^{L_2} b_j \hat{x}_{k-j} - x_k$$

In the expression above for $e_k$, the term $a_j$ represents the coefficients of the feedforward filter 502 and $b_j$ represents the coefficients of the feedback filter 504, $s_k$ represents the quantized signal and $\hat{x}_k$ is the decoded signal determined by the following rule:

$$\hat{x}_k = 1 \text{ if } z_k \geq 0$$
$$= -1 \text{ else}$$

The mean square error is then found according to:

$$E\{e_k^2\} = E\left\{\left(\sum_{j=0}^{-L_1+1} a_j s_{k-j} - \sum_{j=1}^{L_2} b_j \hat{x}_{k-j} - x_k\right)^2\right\}$$

The partial derivative, with respect to $r_n$, is:

$$\frac{\partial E\{e_k^2\}}{\partial r_n} = 2E\left\{e_k\left(\sum_{n \in J_n} a_n\right)\right\},$$

where $J_n = \{j | s_{k-j} = r_n\}$.—approximate the derivative—standard step—sign LMS algorithm;

Hence the sign-LMS update equation to adapt the quantizer output can be written as $$r_n^{k+1} = r_n^k - \mu_t \text{sgn}\{e_k\} \sum_{j \in J_n} a_j,$$

where $J_n = \{j | s_{k-j} = r_n^k\}$.

In one embodiment the quantizer thresholds are updated according to:

$$t_i = \frac{r_i + r_{i+1}}{2} \ \forall \ i = 1, \ldots, N.$$

In one embodiment, the equalizer coefficients are held constant while the thresholds are being adapted. In a further embodiment, the thresholds on the ADC and the DFE are iteratively adapted. While the ADC thresholds are being adapted the DFE coefficients are held constant. While the DFE coefficients are being adapted, the ADC thresholds are held constant.

In the Adaptive Min-BER, or AMBER algorithm, it is preferred to update only when an error has occurred. In this embodiment, $I_k$ is an indicator function that has a value of one when an error has occurred, and zero otherwise.

The AMBER algorithm may be used to adapt the quantizer output and its thresholds can be written as $$r_n^{k+1} = r_n^k - \mu_t I_k \text{sgn}\{e_k\} \sum_{j \in J_n} a_j,$$

where $J_n = \{j | s_{k-j} = r_n^k\}$ and $$t_i = \frac{r_i + r_{i+1}}{2} \ \forall \ i = 1, \ldots, N.$$

Set forth below in Table 1 is a summary of one preferred algorithm for adjusting the ADC thresholds and representation levels $r_n$.

TABLE 1

Input:
    Training Sequence: $x_1^P$
    Output of the channel: $y_1^T$ TABLE 1-continued

```
Output:
    Coefficients of the feedforward filter of the DFE: a
    Coefficients of the feedback filter of the DFE: b
    ADC thresholds: t
    Output values of the ADC: r
Initialization:
    μc = 0.001
    μt = 0
    a = [0 0 . . . 0 1]^T
    b = [0 . . . 0]^T
    t and r such that the quantizer is uniform
Algorithm:
Training Mode
FOR k = 1 TO P1 < P DO
    Calculate zk
    Calculate ek = zk − xk
    Calculate lk using T = −1
    Update a and b using the AMBER algorithm
END
    μ_c = 0.0001
    μ_t = 0.001
FOR k = P1 + 1 TO P DO
    Calculate z_k
    Calculate e_k = z_k − x_k
    Calculate l_k using T = −1
    Update r using the AMBER algorithm
    Calculate t
    Update a and b using the AMBER algorithm
END
Independent Mode
    μc = 0.00001
    μt = 0.0001
FOR k = P + 1 TO T DO
    Calculate z_k
    Calculate e_k = z_k − x_k
    Calculate l_k using T = −0.9
    Update r using the AMBER algorithm
    Calculate t
    Update a and b using the AMBER algorithm
END
```

By establishing system performance criteria by which to select or adjust the signal value range associated with each digital representation, substantially fewer bits may be used in the ADC. The systems and methods described herein enable lower-power, smaller form-factor designs as well as very high-speed operation. In particular, this technology may be beneficial for use in communications systems because it enables ADC's to operate at speeds where traditional ADC designs simply cannot.

While exemplary embodiments have been described, persons of skill in the art will appreciate that variations may be made without departure from the scope and spirit of the invention.

What is claimed is:

1. A communications apparatus comprising:
an analog-to-digital converter (ADC) comprising:
  a threshold generator converter configured to:
    receive a control input that defines converter threshold voltages; and
    generate a set of threshold voltages based on the control input;
  a plurality of comparators configured to receive the set of threshold voltages; and
  a mapper configured to generate a digital output representative of an applied analog-input voltage wherein the digital output is determined in part by the set of threshold voltages; and
an update component configured to control both the threshold generator and the mapper wherein the update component provides analog voltages as control inputs to the threshold generator, wherein the update component is configured to utilize detection rules for making symbol decisions, wherein the detection rules are expressed in terms of input voltage ranges, and wherein the ADC is adjusted in response to the input voltage ranges specified by the detection rules.

2. The communications apparatus of claim 1 wherein a subset of the plurality of comparators are disabled.

3. The communications apparatus of claim 1 wherein the generated threshold voltages are generated based on one or more performance criteria.

4. The communications apparatus of claim 1 wherein the generated threshold voltages are adjusted randomly.

5. The communications apparatus of claim 1 wherein the detection rules provide detection regions that span multiple symbol periods or lead to state-dependent input ranges.

6. The communications apparatus of claim 1 wherein the generated threshold voltages are adjusted based on a channel estimate.

7. The communications apparatus of claim 1 wherein the generated threshold voltages are adjusted based on an adaption algorithm.

8. A computer-implemented method for controlling an analog-to-digital converter (ADC), comprising:
receiving a control input that defines converter threshold voltages;
generating a set of threshold voltages based on the control input using a threshold generator;
providing the set of threshold voltages to a plurality of comparators;
generating via a mapper and providing to an update component a digital output representative of an applied analog input voltage wherein the digital output is determined in part by the set of threshold voltages, wherein the update component is configured to control both the threshold generator and the mapper, and wherein the update component provides analog voltages as control inputs to the threshold generator; and
utilizing detection rules for making symbol decisions, wherein the detection rules are expressed in terms of input voltage ranges, and wherein the ADC is adjusted in response to the input voltage ranges specified by the detection rules.

9. The method of claim 8 wherein a subset of the plurality of comparators are disabled.

10. The method of claim 8 wherein generated threshold voltages are generated based on one or more performance criteria.

11. The method of claim 8 wherein the generated threshold voltages are adjusted randomly.

12. The method of claim 8 wherein the detection rules provide detection regions that span multiple symbol periods or lead to state-dependent input ranges.

13. The method of claim 8 wherein the generated threshold voltages are adjusted based on a channel estimate.

14. The method of claim 8 wherein the generated threshold voltages are adjusted based on an adaption algorithm.

15. A computer-implemented method for controlling an analog-to-digital converter (ADC), comprising:
generating a set of threshold voltages using a threshold generator;
applying the set of threshold voltages to a plurality of comparators;
generating via a mapper and providing to an update component a digital output representing an input analog voltage, wherein the update component is configured to control both the threshold generator and the mapper, and wherein the update component provides analog voltages as control inputs to the threshold generator; and determining a performance criteria associated with signal processing carried out on the digital output;

updating the set of threshold voltages in response to the performance criteria; and utilizing detection rules for making symbol decisions, wherein the detection rules are expressed in terms of input voltage ranges, and wherein the ADC is adjusted in response to the input voltage ranges specified by the detection rules.

16. The method of claim 15 wherein a subset of the plurality of comparators are disabled.

17. The method of claim 15 wherein the performance criteria is bit error rate.

18. The method of claim 15 wherein the performance criteria is an error signal.

19. The method of claim 15 wherein the performance criteria is signal to noise ratio.

20. The method of claim 15 wherein the performance criteria is likelihood of the transmitted symbols.

* * * * *